United States Patent
Chen et al.

(10) Patent No.: US 9,642,279 B2
(45) Date of Patent: May 2, 2017

(54) RAIL MOUNTING STRUCTURE

(71) Applicants: KING SLIDE WORKS CO., LTD., Kaohsiung (TW); KING SLIDE TECHNOLOGY CO., LTD., Kaohsiung (TW)

(72) Inventors: Ken-Ching Chen, Kaohsiung (TW); Shun-Ho Yang, Kaohsiung (TW); Chien-Li Huang, Kaohsiung (TW); Chun-Chiang Wang, Kaohsiung (TW)

(73) Assignees: King Slide Works Co., Ltd., Kaohsiung (TW); King Slide Technology Co., Ltd., Kaohsiung (TW)

( * ) Notice: Subject to any disclaimer, the term of this patent is extended or adjusted under 35 U.S.C. 154(b) by 8 days.

(21) Appl. No.: 14/645,756

(22) Filed: Mar. 12, 2015

(65) Prior Publication Data

US 2016/0262539 A1    Sep. 15, 2016

(51) Int. Cl.
*A47B 88/04* (2006.01)
*H05K 7/14* (2006.01)
*A47B 88/427* (2017.01)

(52) U.S. Cl.
CPC ......... *H05K 7/1489* (2013.01); *A47B 88/427* (2017.01); *A47B 2088/4274* (2017.01)

(58) Field of Classification Search
CPC ..... A47B 88/044; A47B 96/067; A47B 96/07; A47B 2088/0444
USPC .............................. 248/241; 312/333, 334.46
See application file for complete search history.

(56) References Cited

U.S. PATENT DOCUMENTS

| 6,209,979 | B1 | 4/2001 | Fall et al. | |
|---|---|---|---|---|
| 6,601,933 | B1 | 8/2003 | Greenwald | |
| 7,661,778 | B2 | 2/2010 | Yang et al. | |
| 7,871,139 | B2* | 1/2011 | Yu .................. | A47B 88/044 312/333 |
| 8,366,217 | B1 | 2/2013 | Chen et al. | |
| 8,528,999 | B2 | 9/2013 | Chen et al. | |
| 8,562,085 | B2 | 10/2013 | Chen et al. | |
| 2007/0018547 | A1* | 1/2007 | Yang ............... | H05K 7/1489 312/333 |
| 2012/0106880 | A1* | 5/2012 | Chen ............... | A47B 88/044 384/49 |
| 2013/0058596 | A1* | 3/2013 | Chen ............... | A47B 88/14 384/7 |
| 2015/0129526 | A1* | 5/2015 | Chen ............... | A47B 88/044 211/134 |

* cited by examiner

*Primary Examiner* — Anita M King
(74) *Attorney, Agent, or Firm* — Rosenberg, Klein & Lee

(57) ABSTRACT

A rail mounting structure includes a rail member, an auxiliary member, and a resilient member. The rail member includes first and second mounting slots. The auxiliary member is movably mounted to the rail member and includes first and second portions. The resilient member provides a resilient force acting on the auxiliary member such that the auxiliary member is kept at a predetermined position relative to the rail member where the first and second portions of the auxiliary member are adjacent to the first and second mounting slots respectively.

15 Claims, 12 Drawing Sheets

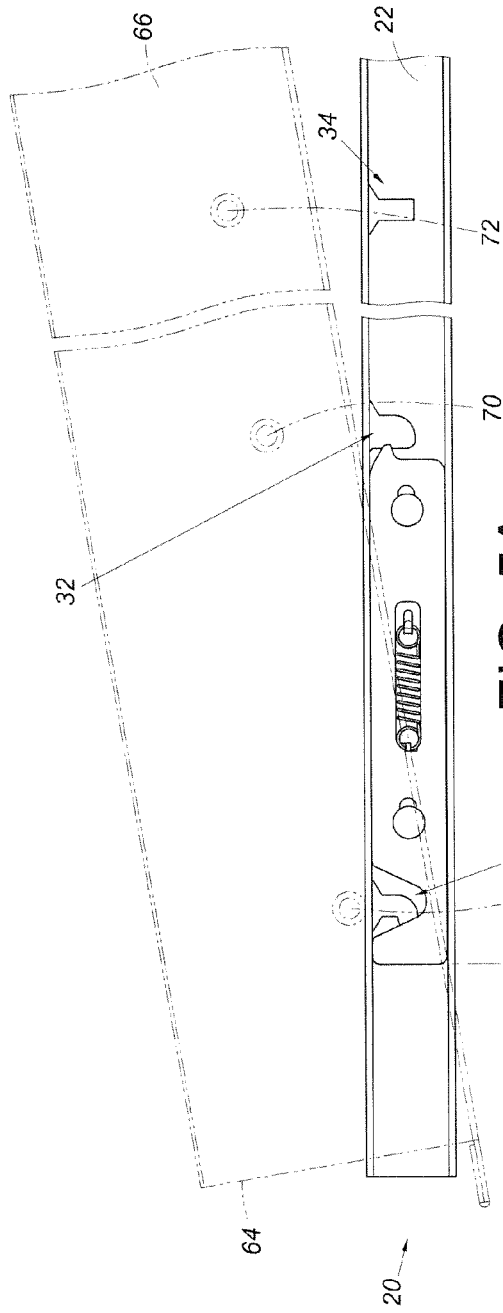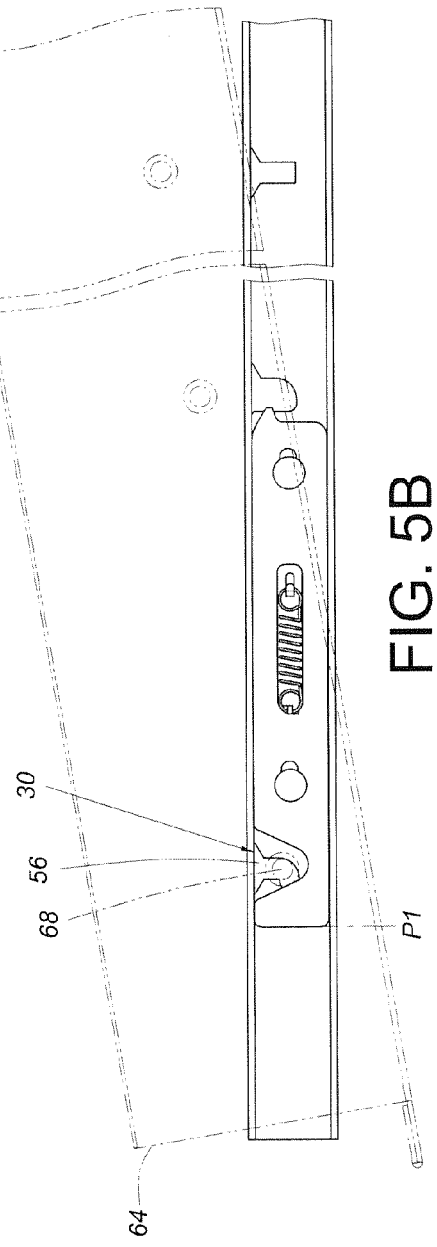

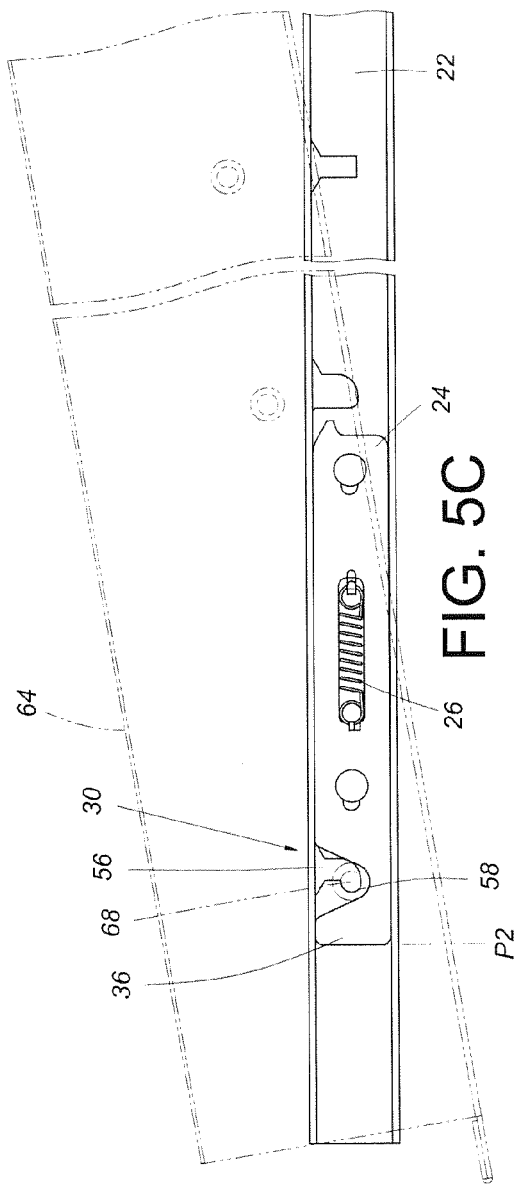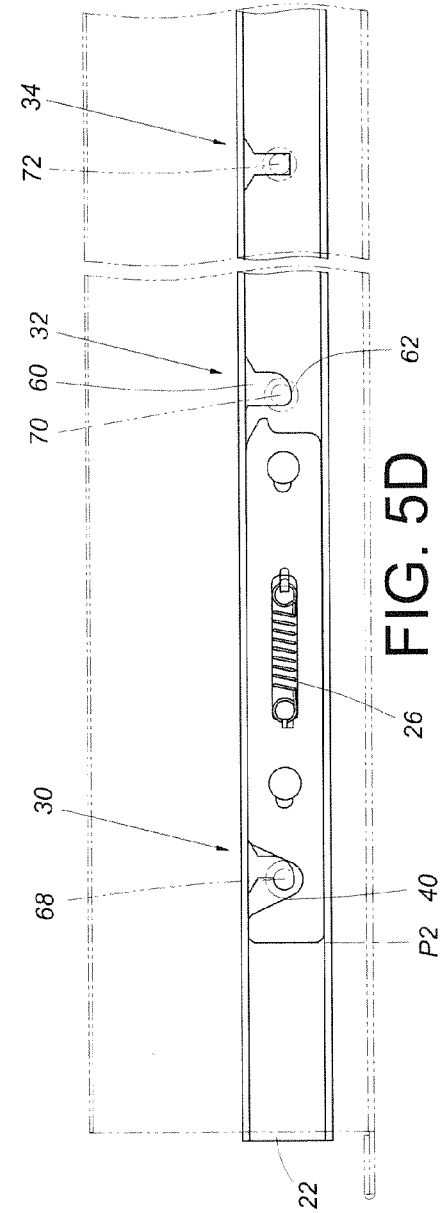

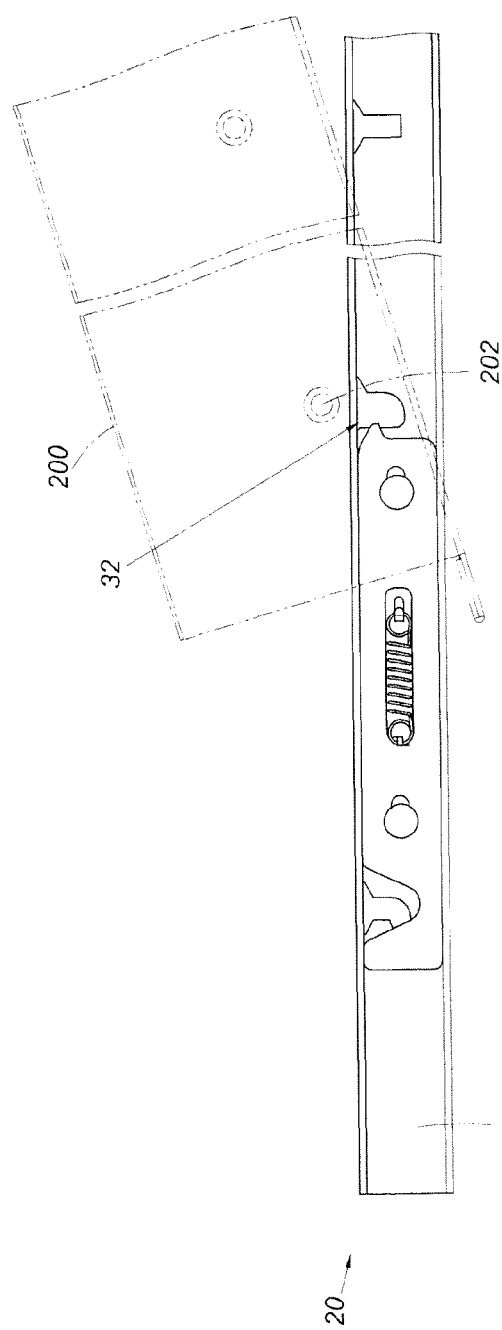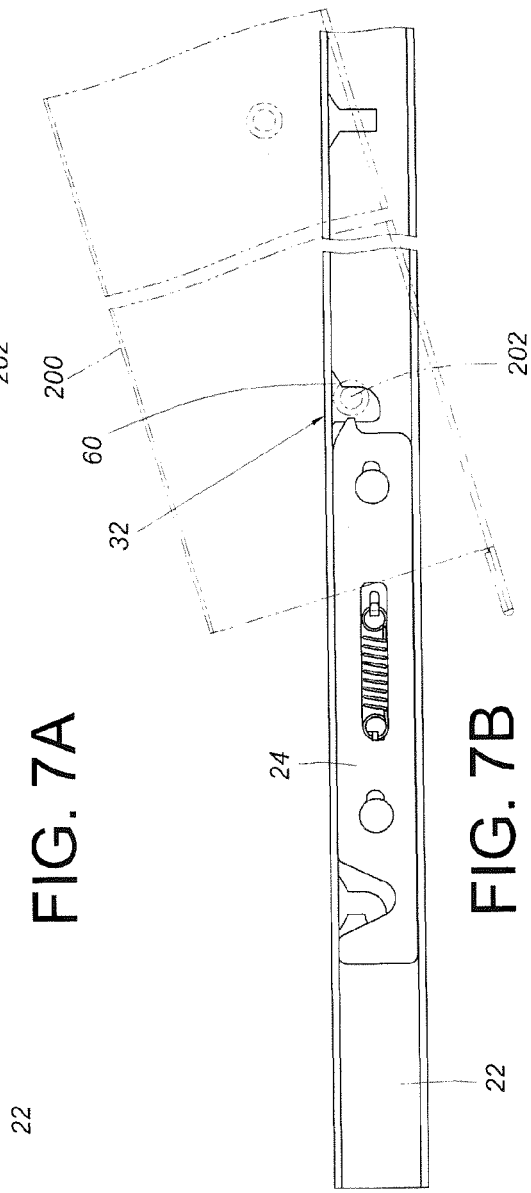
FIG. 7A
FIG. 7B

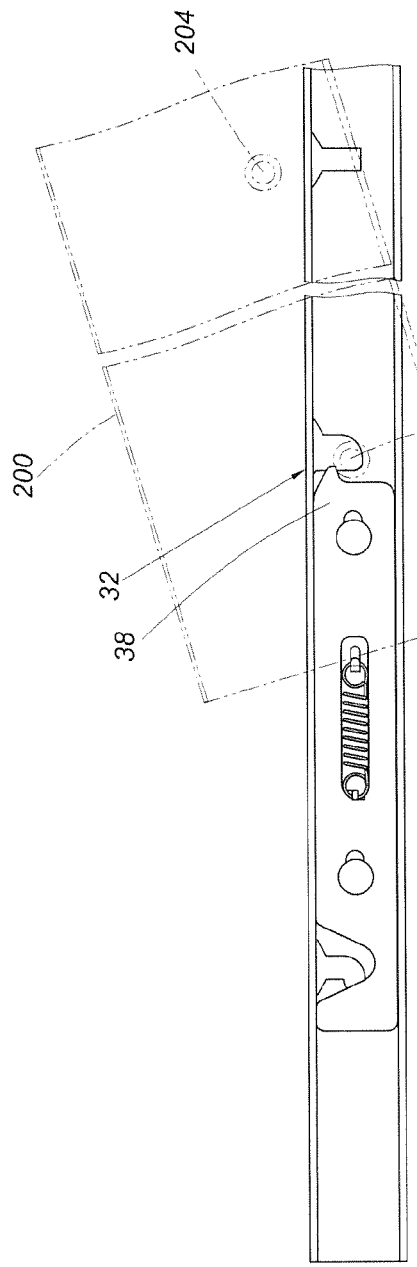
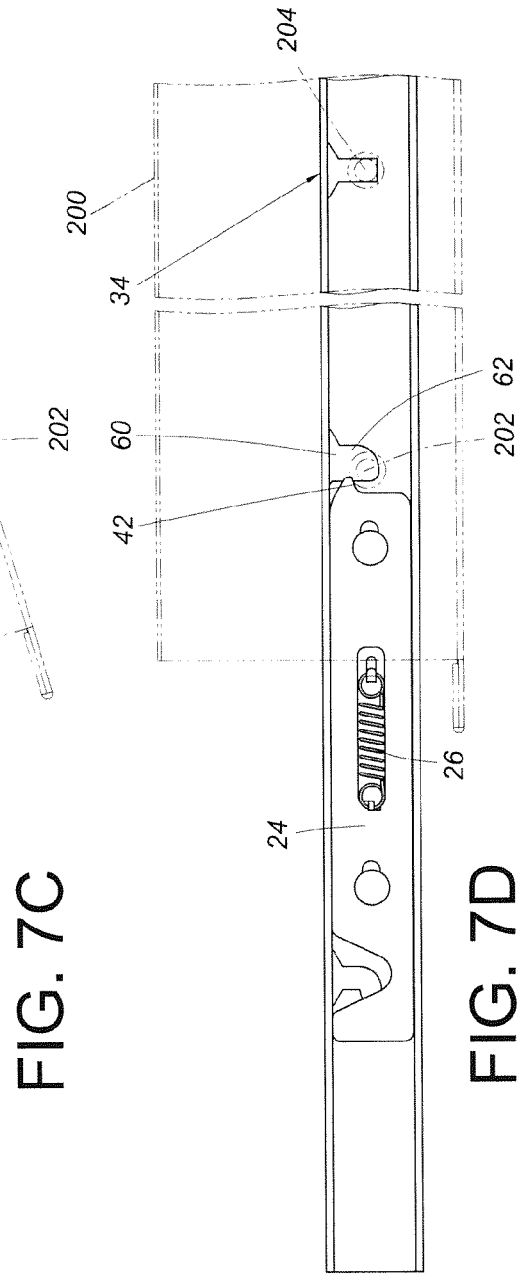
FIG. 7C
FIG. 7D

RAIL MOUNTING STRUCTURE

FIELD OF THE INVENTION

The present invention relates to a slide rail and more particularly to a rail mounting structure to which objects of different length specifications can be mounted.

BACKGROUND OF THE INVENTION

Generally, a slide rail assembly includes a first rail and a second rail, wherein the second rail can be longitudinally displaced relative to the first rail in order to be located at a retracted or extended position. Also, the second rail can be mounted with an object (e.g., apiece of electronic equipment, a drawer, or the like), and the way in which the object is mounted to the second rail may vary, depending on actual mounting requirements. For example, U.S. Pat. No. 6,938, 967 B2 discloses a slide rail assembly having a rail member with a mounting slot, wherein the mounting slot is adapted to engage with a mounting post of an object. The disclosure of the aforesaid patent is incorporated herein by reference.

SUMMARY OF THE INVENTION

The present invention relates to a rail mounting structure applicable to objects of different length specifications.

According to one aspect of the present invention, a rail mounting structure includes a rail member, an auxiliary member, and a resilient member. The rail member includes a first mounting slot and a second mounting slot. The auxiliary member is movably mounted to the rail member and includes a first portion and a second portion. The resilient member provides a resilient force acting on the auxiliary member. The auxiliary member is kept at a predetermined position relative to the rail member by the resilient force of the resilient member. While the auxiliary member is at the predetermined position, the first portion of the auxiliary member is adjacent to the first mounting slot, and the second portion of the auxiliary member is adjacent to the second mounting slot.

The first mounting slot preferably includes an entrance portion and a positioning portion, wherein the entrance portion of the first mounting slot extends downward from the top of the rail member and forms an entrance while the positioning portion of the first mounting slot extends substantially perpendicularly from the bottom of the entrance portion for a distance. The first portion of the auxiliary member preferably further includes an extended section which extends to a position corresponding to the positioning portion of the first mounting slot.

The second mounting slot preferably includes an entrance portion and a positioning portion, wherein the entrance portion of the second mounting slot extends downward from the top of the rail member and forms an entrance while the positioning portion of the second mounting slot is located at the bottom of the entrance portion. The second portion of the auxiliary member preferably further includes an extended section which extends to a position corresponding to a position between the entrance portion and the positioning portion of the second mounting slot.

Preferably, each of the rail member and the auxiliary member further includes a connecting portion, and the resilient member is connected between the two connecting portions. In addition, it is preferable that the auxiliary member further includes an elongated aperture, and that the resilient member is located in the elongated aperture.

Preferably, the rail member further includes a contact portion, and the resilient member is connected to the auxiliary member and pressed against the contact portion.

According to another aspect of the present invention, a rail mounting structure is provided for use with an object including a first mounting member and a second mounting member. The rail mounting structure includes a rail member, an auxiliary member, and a resilient member. The rail member includes a first mounting slot and a second mounting slot. The auxiliary member is movably mounted to the rail member and includes a first portion and a second portion, wherein the first portion is adjacent to the first mounting slot and the second portion is adjacent to the second mounting slot. The resilient member provides a resilient force acting on the auxiliary member. In the course in which the first mounting member of the object is mounted to the first mounting slot of the rail member, the first mounting member of the object pushes the first portion of the auxiliary member and overcomes the resilient force of the resilient member such that the auxiliary member is displaced to a position, allowing the second mounting member of the object to be mounted to the second mounting slot of the rail member.

Preferably, the first mounting slot includes an entrance portion and a positioning portion; the entrance portion of the first mounting slot extends downward from the top of the rail member and forms an entrance; the positioning portion of the first mounting slot extends substantially perpendicularly from the bottom of the entrance portion for a distance; the first portion of the auxiliary member further includes an extended section which is adjacent to one side of the positioning portion of the first mounting slot; and the first mounting member further includes a head section and a body section connected to the head section. In the course in which the body section of the first mounting member is mounted to the positioning portion of the first mounting slot, the head section of the first mounting member pushes the extended section of the first portion of the auxiliary member and thereby displaces the auxiliary member.

Preferably, the second mounting slot includes an entrance portion and a positioning portion, the entrance portion of the second mounting slot extends downward from the top of the rail member and forms an entrance, the positioning portion of the second mounting slot is located at the bottom of the entrance portion, and the second portion of the auxiliary member further includes an extended section which is adjacent to a position between the entrance portion and the positioning portion of the second mounting slot.

According to yet another aspect of the present invention, a rail mounting structure includes a rail member, an auxiliary member, and a resilient member. The rail member includes a first mounting slot including an entrance portion and a positioning portion, wherein the entrance portion extends downward from a top of the rail member and font's an entrance, and the positioning portion extends substantially perpendicularly from a bottom of the entrance portion for a distance. The auxiliary member is movably mounted to the rail member and includes a first portion adjacent to the first mounting slot. The resilient member is configured to provide a resilient force acting on the auxiliary member.

One of the advantageous features of applying the present invention is that the rail mounting structure can be applied to objects of different length specifications.

BRIEF DESCRIPTION OF THE DRAWINGS

The structure as well as a preferred mode of use and the advantages of the present invention will be best understood by referring to the following detailed description of some illustrative embodiments in conjunction with the accompanying drawings, in which:

FIG. 5A shows how the object in FIG. 4 is mounted to the rail mounting structure in the first embodiment of the present invention;

FIG. 5B further shows how the object in FIG. 4 is mounted to the rail mounting structure in the first embodiment of the present invention, or more particularly how the first mounting member of the object enters the first mounting slot of the rail member;

FIG. 5C further shows how the object in FIG. 4 is mounted to the rail mounting structure in the first embodiment of the present invention, or more particularly how the first mounting member of the object is mounted to the positioning portion of the first mounting slot and how the auxiliary member is pushed by the first mounting member and therefore displaced to a different position;

FIG. 5D further shows how the object in FIG. 4 is mounted to the rail mounting structure in the first embodiment of the present invention, wherein the object has been mounted to the rail member;

FIG. 7A shows how the object in FIG. 6 is mounted to the rail mounting structure in the first embodiment of the present invention;

FIG. 7B further shows how the object in FIG. 6 is mounted to the rail mounting structure in the first embodiment of the present invention, or more particularly how a mounting member of the object enters the second mounting slot of the rail member;

FIG. 7C further shows how the object in FIG. 6 is mounted to the rail mounting structure in the first embodiment of the present invention, or more particularly how the aforesaid mounting member of the object is mounted to the positioning portion of the second mounting slot and blocked by the extended section of the second portion of the auxiliary member;

FIG. 7D further shows how the object in FIG. 6 is mounted to the rail mounting structure in the first embodiment of the present invention, wherein the object has been mounted to the rail member;

DETAILED DESCRIPTION OF THE INVENTION

Figure 1:
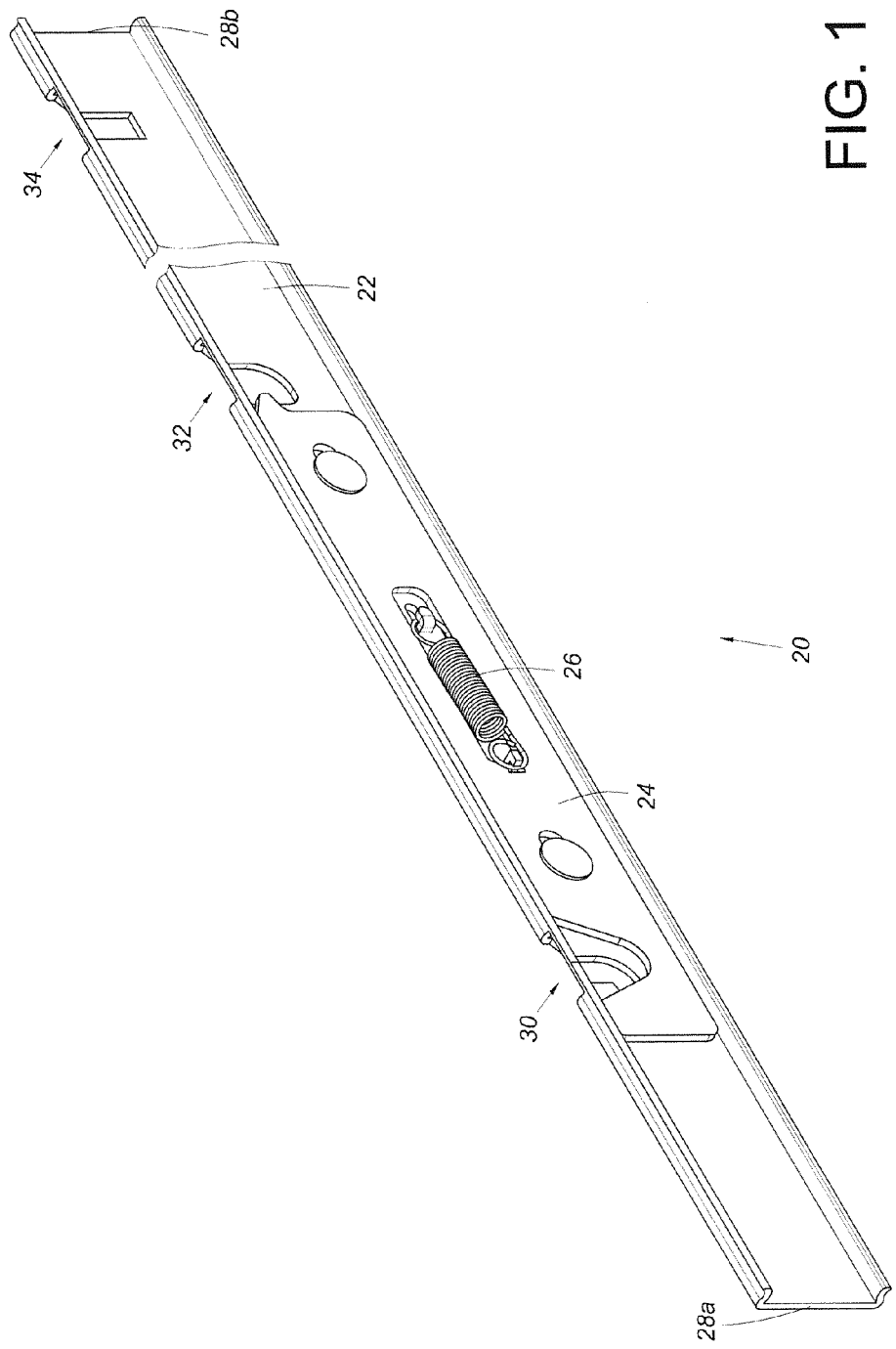
FIG. 1 is a perspective view of the rail mounting structure in the first embodiment of the present invention.
Figure 2:
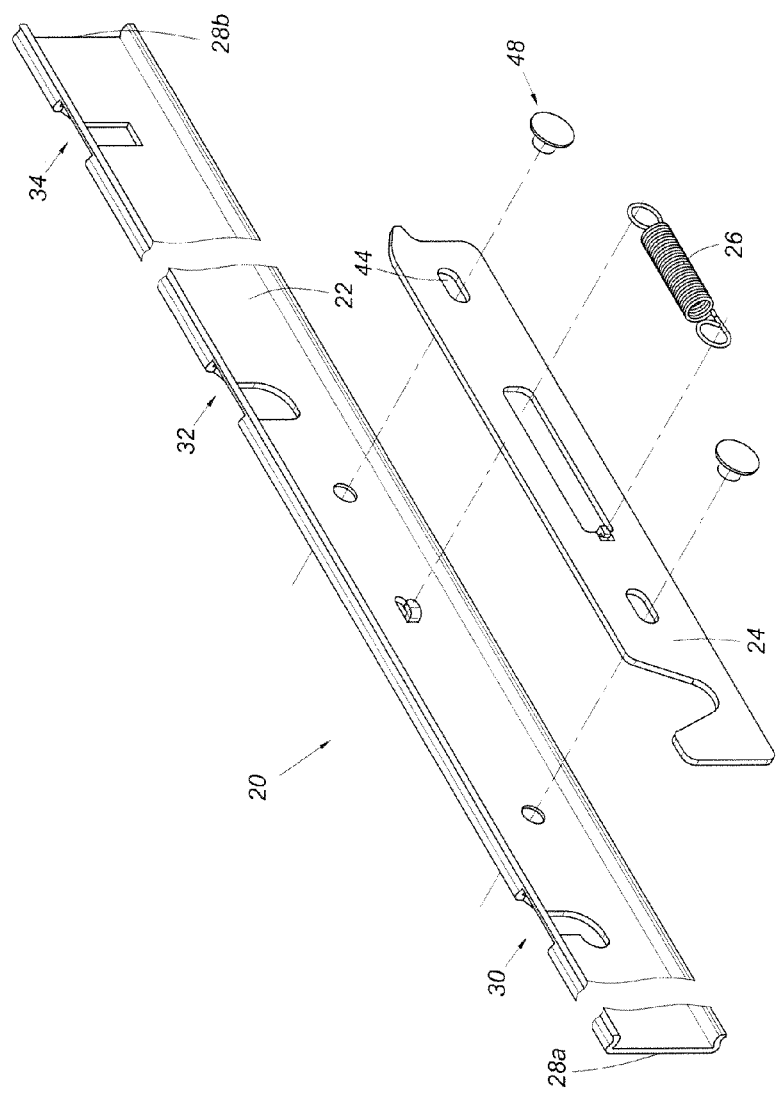
FIG. 2 is an exploded perspective view of the rail mounting structure in the first embodiment of the present invention.

Referring to FIG. 1 and FIG. 2, the rail mounting structure 20 according to an embodiment of the present invention includes a rail member 22, an auxiliary member 24, and a resilient member 26.

The rail member 22 has a first end portion 28a and a second end portion 28b opposite the first end portion 28a. The rail member 22 also includes a first mounting slot 30 and a second mounting slot 32, both of which are located between the first end portion 28a and the second end portion 28b. In this embodiment, the rail member 22 further includes another mounting slot (e.g., a third mounting slot 34). The first mounting slot 30 and the second mounting slot 32 are adjacent to the first end portion 28a of the rail member 22 while the third mounting slot 34 is adjacent to the second end portion 28b of the rail member 22. Preferably, the second mounting slot 32 and the third mounting slot 34 are of similar slot configurations different from that of the first mounting slot 30. In practice, the locations of the mounting slots are not limited to those disclosed herein, and each two adjacent mounting slots can be spaced by a predetermined distance depending on practical needs.

Figure 3:
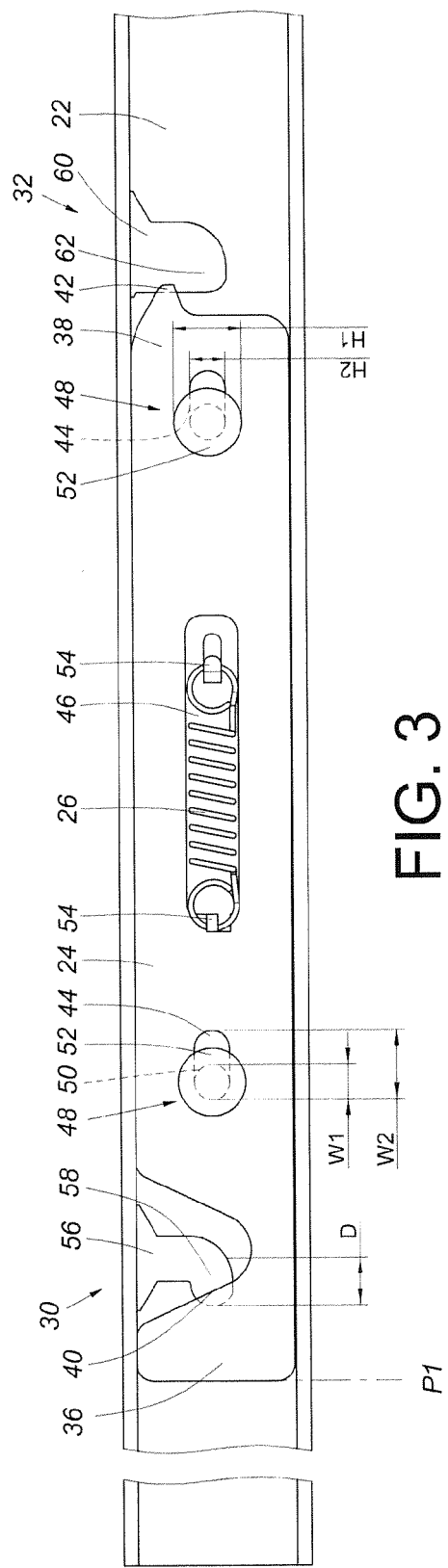
FIG. 3 is a side view of the rail mounting structure in the first embodiment of the present invention, showing in particular the structural arrangement of the rail member, the auxiliary member, and the resilient member.

As shown in FIG. 2 and FIG. 3, the auxiliary member 24 is mounted to the rail member 22 and includes a first portion 36 and a second portion 38. The first portion 36 and the second portion 38 have an extended section 40 and an extended section 42 respectively. Preferably, the auxiliary member 24 further includes at least one guide groove 44 and an elongated aperture 46. In this embodiment, two guide grooves 44 are provided by way of example for use with two connecting elements 48 respectively, and the elongated aperture 46 is located between the two guide grooves 44. The auxiliary member 24 is movably connected to the rail member 22 by the two connecting elements 48. More specifically, each connecting element 48 has a body 50 and a head 52 connected to the body 50, wherein the body 50 has a width W1 less than a width W2 of each guide groove 44 and the head 52 has a height H1 greater than a height H2 of each guide groove 44. With this arrangement, the body 50 of each connecting element 48 can be passed through one of the guide grooves 44 and connected to the rail member 22, with the head 52 of the connecting element 48 blocked outside the guide groove 44, so that the auxiliary member 24 can be displaced relative to the rail member 22 within the limited range defined by the guide grooves 44. The resilient member 26 serves to provide a resilient force acting on the auxiliary member 24. Here, the resilient member 26 is mounted between the rail member 22 and the auxiliary member 24. For example, each of the rail member 22 and the auxiliary member 24 further includes a connecting portion 54, and the resilient member 26 is connected between the two connecting portions 54 and located in the elongated aperture 46 of the auxiliary member 24. The structural arrangement described above allows the auxiliary member 24 to be displaced relative to the rail member 22 in a stable manner.

As shown in FIG. 3, the auxiliary member 24 is kept at a predetermined position P1 relative to the rail member 22 by the resilient force of the resilient member 26. While the auxiliary member 24 is at the predetermined position P1, the first portion 36 of the auxiliary member 24 is adjacent to the first mounting slot 30, and the second portion 38 of the auxiliary member 24 is adjacent to the second mounting slot 32. In a preferred embodiment, the extended section 40 of the first portion 36 of the auxiliary member 24 extends in such a way that it covers the first mounting slot 30 partially, and the extended section 42 of the second portion 38 of the auxiliary member 24 extends in such a way that it covers the second mounting slot 32 partially.

The first mounting slot 30 preferably includes an entrance portion 56 and a positioning portion 58. The entrance portion 56 extends downward from the top of the rail member 22 and forms an entrance. The positioning portion 58 extends substantially perpendicularly from the bottom of the entrance portion 56 for a distance D. The entrance portion 56 and the positioning portion 58 jointly constitute a generally J-shaped groove. More specifically, the extended section 40 of the first portion 36 of the auxiliary member 24 extends to a part of the positioning portion 58 of the first mounting slot 30. The second mounting slot 32, on the other hand, includes an entrance portion 60 and a positioning portion 62. The entrance portion 60 also extends downward from the top of the rail member 22 and forms an entrance. The positioning portion 62 is located at the bottom of the entrance portion 60. The entrance portion 60 and the positioning portion 62 jointly constitute a generally U-shaped groove. The extended section 42 of the second portion 38 of the auxiliary member 24 extends to a position between the entrance portion 60 and the positioning portion 62 of the second mounting slot 32.

Figure 4:
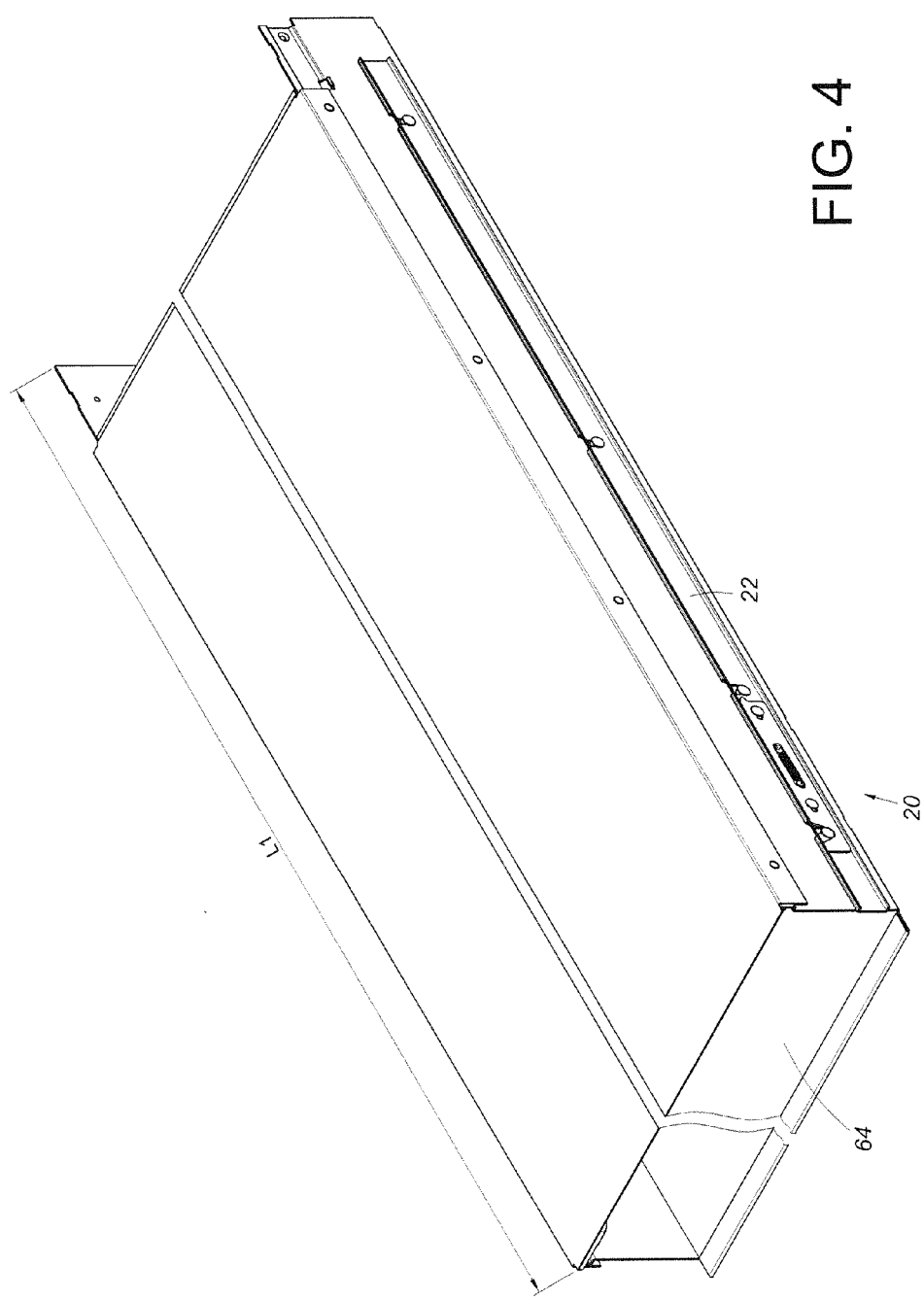
FIG. 4 is a perspective view in which the rail mounting structure in the first embodiment of the present invention is applied to an object capable of being mounted to the rail mounting structure.

In FIG. 4, the rail mounting structure 20 is applied to an object 64 such as the chassis of a piece of electronic equipment, a drawer, or the like. The object 64 has a length L1 and can be mounted to the rail member 22.

FIG. 5A and FIG. 5B show how the object 64 is mounted to the rail member 22 of the rail mounting structure 20. When it is desired to mount the object 64 to the rail member 22, the plural mounting members (e.g., a first mounting member 68, a second mounting member 70, and a third mounting member 72) mounted on a sidewall 66 of the object 64 are respectively aligned with the first mounting slot 30, the second mounting slot 32, and the third mounting slot 34 of the rail member 22. For example, the assembly process begins by putting the first mounting member 68 of the object 64 into the entrance portion 56 of the first mounting slot 30. After that, referring to FIG. 5C and FIG. 5D, the first mounting member 68 of the object 64 is moved from the entrance portion 56 to the positioning portion 58 of the first mounting slot 30, during which time the first mounting member 68 pushes the first portion 36 of the auxiliary member 24 and overcomes the resilient force of the resilient member 26 such that the auxiliary member 24 is displaced relative to the rail member 22 from the aforesaid predetermined position P1 to a position P2. On the other hand, the object 64 is lowered, allowing the second mounting member 70 of the object 64 to enter the entrance portion 60 of the second mounting slot 32 of the rail member 22 and be mounted in the positioning portion 62 of the second mounting slot 32. The third mounting member 72 is mounted in the third mounting slot 34 in a similar manner. Thus, the object 64 is mounted to the rail member 22. It is worth mentioning that, once the auxiliary member 24 is displaced to the position P2, the extended section 40 of the first portion 36 of the auxiliary member 24 is pressed against the first mounting member 68 by virtue of the resilient force of the resilient member 26, and vertically upward displacement of the first mounting member 68 is limited due to the shape of the first mounting slot 30. In practice, an engaging mechanism (not shown) can be provided between the third mounting member 72 and the rail member 22 to ensure that the object 64 is mounted securely. When it is desired to remove the object 64 from the rail member 22, the engagement between the third mounting member 72 and the rail member 22 is released first. Then, a lifting force is applied to a portion of the object 64 that is adjacent to the third mounting member 72 to raise that portion of the object 64. Once the object 64 forms a proper inclination angle with the rail member 22, the first mounting member 68 and the second mounting member 70 of the object 64 can be removed from the first mounting slot 30 and the second mounting slot 32 of the rail member 22 respectively, allowing the entire object 64 to be detached from the rail member 22 with ease.

Figure 6:
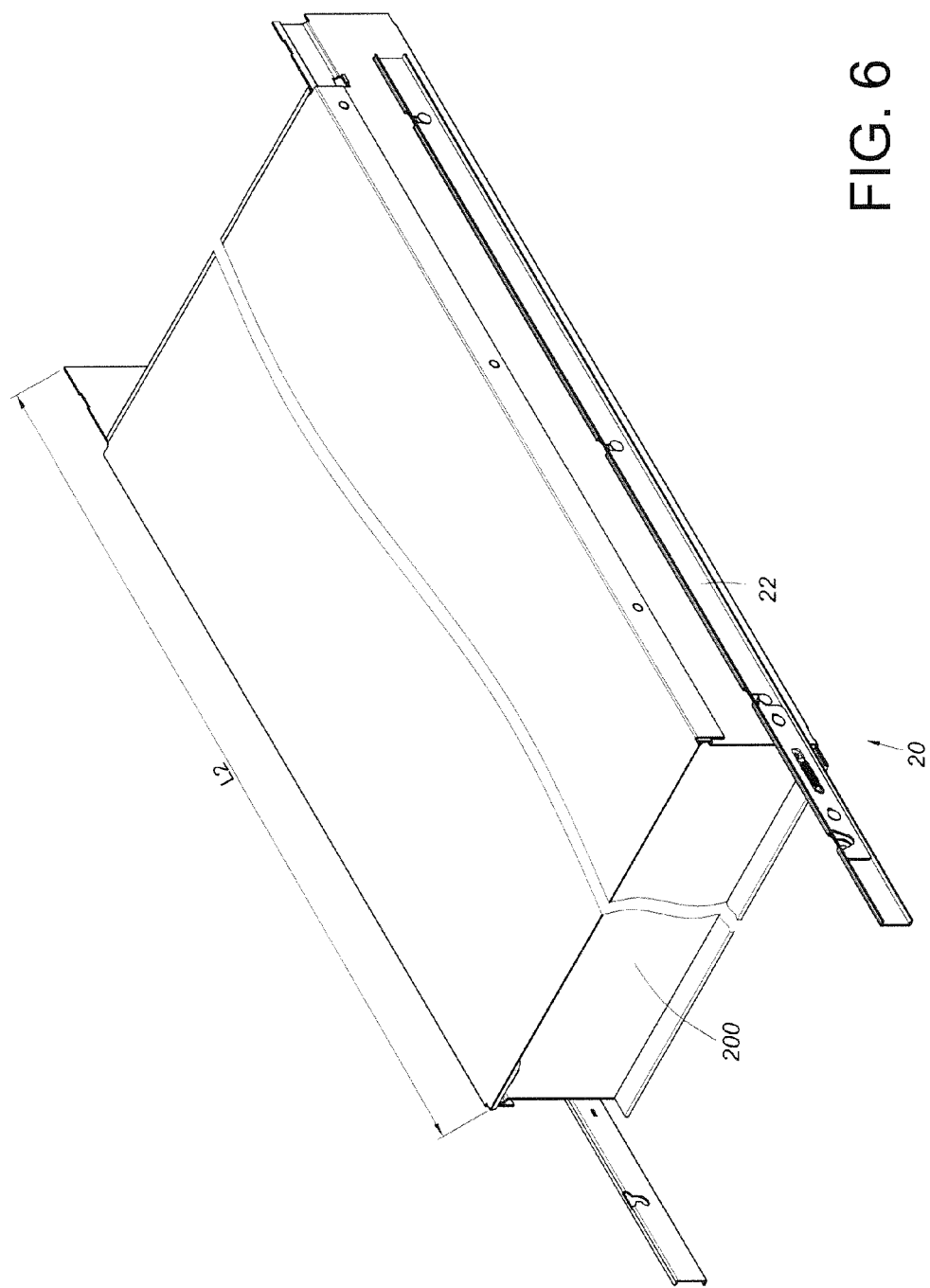
FIG. 6 is a perspective view in which the rail mounting structure in the first embodiment of the present invention is applied to another object capable of being mounted to the rail mounting structure.

In FIG. 6, the rail mounting structure 20 is applied to another object 200, which has a length L2 different from the length L1 of the object 64 shown in FIG. 4, and which can be mounted to the rail member 22.

FIG. 7A and FIG. 7B show how the object 200 is mounted to the rail member 22 of the rail mounting structure 20. When it is desired to mount the object 200 to the rail member 22, one of the mounting members (e.g., the mounting member 202) on a sidewall of the object 200 is aligned with the second mounting slot 32 of the rail member 22. More specifically, the mounting member 202 of the object 200 is put into the entrance portion 60 of the second mounting slot 32 and, as shown in FIG. 7C and FIG. 7D, is subsequently moved from the entrance portion 60 to the positioning portion 62 of the second mounting slot 32 such that the mounting member 202 is pressed against the extended section 42 of the second portion 38 of the auxiliary member 24. Afterward, by lowering the object 200, another mounting member 204 of the object 200 is mounted in the third mounting slot 34 of the rail member 22. Thanks to the resilient force of the resilient member 26, the extended section 42 of the second portion 38 of the auxiliary member 24 is now pressed against the mounting member 202, and the object 200 is thus mounted to the rail member 22. As with the first mounting slot 30 of the rail member 22 and the first mounting member 68 in the previous case, the engagement between the mounting member 202 of the object 200 and the extended section 42 of the second portion 38 of the auxiliary member 24 limits vertically upward displacement of the mounting member 202, thereby ensuring that the object 200 is mounted securely. Detachment of the object 200 can be carried out in a way similar to that of the object 64 and therefore is not described repeatedly.

Figure 8:
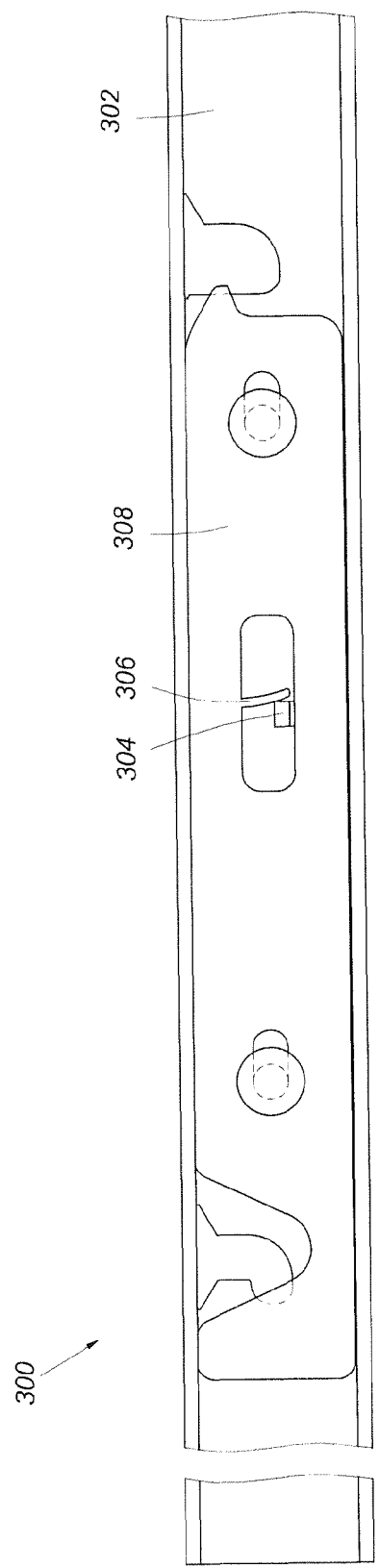
FIG. 8 is a side view of the rail mounting structure in the second embodiment of the present invention.

FIG. 8 shows the rail mounting structure 300 in another embodiment of the present invention. This embodiment is different from the previous one substantially in that the rail member 302 of the rail mounting structure 300 includes a contact portion 304, and that the resilient member 306 is connected to the auxiliary member 308 and pressed against the contact portion 304. Thus, the auxiliary member 308 is displaceable relative to the rail member 302 when pushed by an article (e.g., a mounting member of an object to be mounted to the rail member 302).

Figure 9:
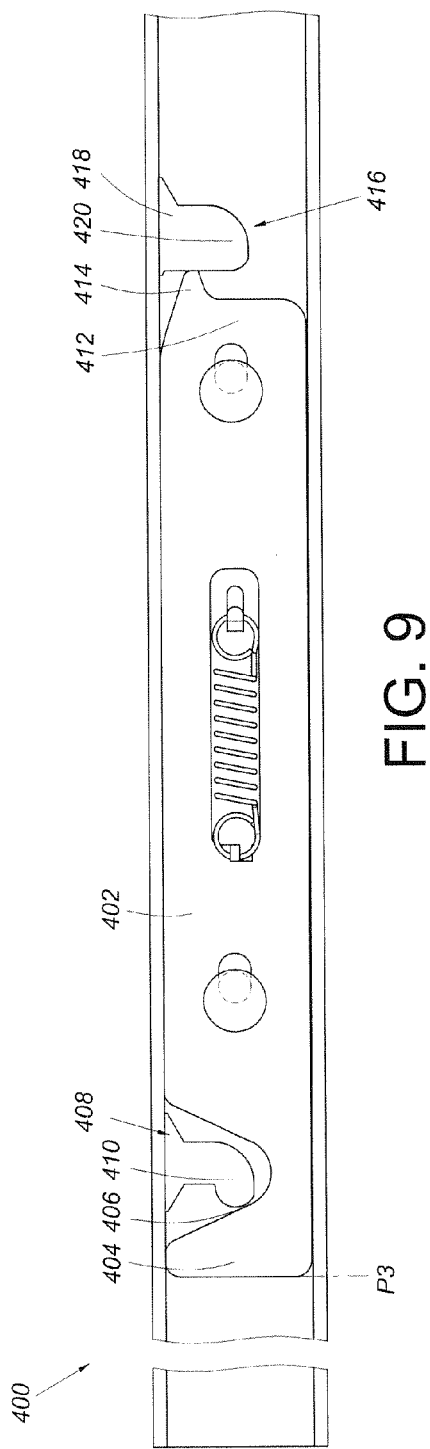
FIG. 9 is a side view of the rail mounting structure in the third embodiment of the present invention.

FIG. 9 shows the rail mounting structure 400 in yet another embodiment of the present invention. This embodiment is different from the embodiment in FIG. 3 substantially in that the first portion 404 of the auxiliary member 402 includes an extended section 406 which is adjacent to, and on one side of, the positioning portion 410 of the first mounting slot 408. On the other hand, the second portion 412 of the auxiliary member 402 includes an extended section 414 adjacent to a position between the entrance portion 418 and the positioning portion 420 of the second mounting slot 416. The auxiliary member 402 is shown in FIG. 9 as at a predetermined position P3.

Figure 10:
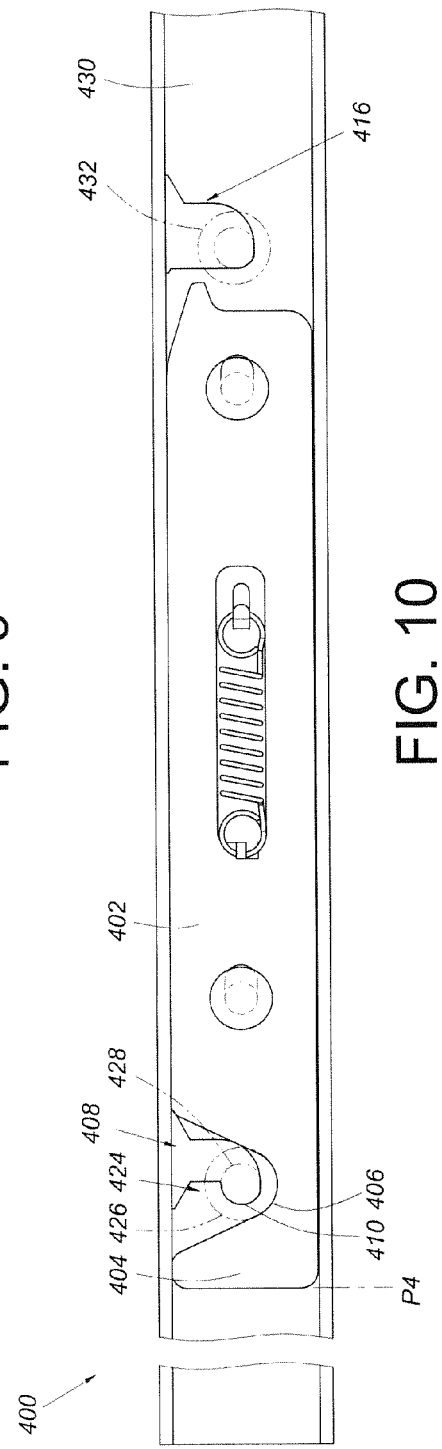
FIG. 10 shows how the first mounting slot and the second mounting slot of the rail mounting structure in the third embodiment of the present invention are mounted with a first mounting member and a second mounting member respectively.

Referring to FIG. 10, the first mounting member 424 of the object mounted to the rail member 430 of the rail mounting structure 400 includes a head section 426 and a body section 428 connected to the head section 426. The head section 426 has a greater diameter than the body section 428. The body section 428 can enter the first mounting slot 408. In the course in which the body section 428 of the first mounting member 424 of the object is mounted to the positioning portion 410 of the first mounting slot 408, the head section 426 of the first mounting member 424 pushes the extended section 406 of the first portion 404 of the auxiliary member 402 such that the auxiliary member 402 is displaced relative to the rail member 430 from the predetermined position P3 to a position P4. The second mounting member 432 of the object, on the other hand, is correspondingly mounted to the second mounting slot 416 of the rail member 430.

Figure 11:
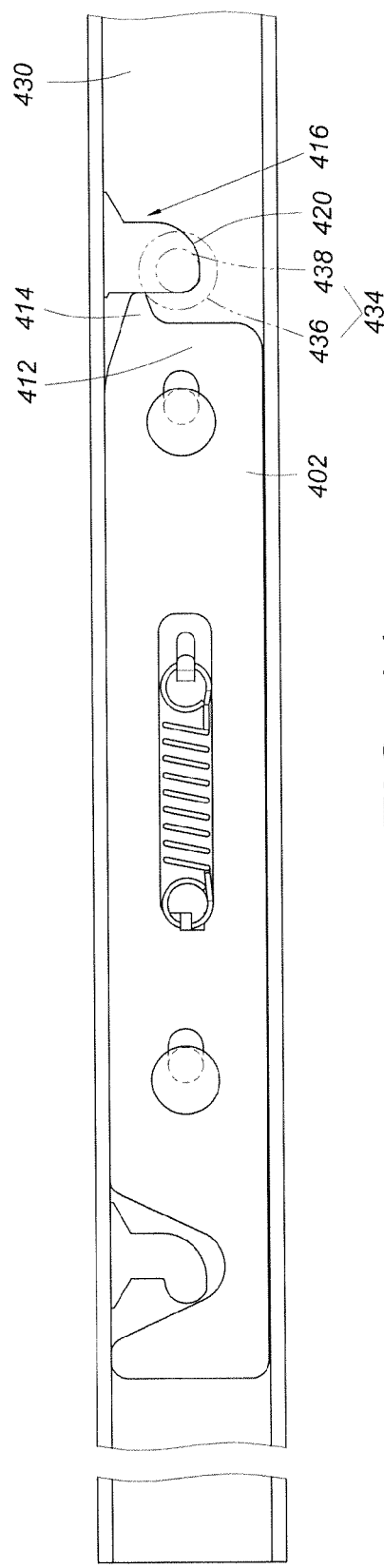
FIG. 11 shows how the second mounting slot of the rail mounting structure in the third embodiment of the present invention is mounted with a mounting member.

As shown in FIG. 11, when the rail mounting structure 400 is applied to another object, one of the mounting members (e.g., the mounting member 434) of this object is correspondingly mounted to the second mounting slot 416 of the rail member 430. More specifically, the mounting member 434 includes a head section 436 and a body section 438 connected to the head section 436. The head section 436 has a greater diameter than the body section 438, and the body section 438 can enter the second mounting slot 416. Once the body section 438 of the mounting member 434 of the object is mounted to the positioning portion 420 of the second mounting slot 416, a portion of the head section 436 of the mounting member 434 is blocked by the extended section 414 of the second portion 412 of the auxiliary member 402.

While the present invention has been disclosed through the foregoing preferred embodiments, the embodiments are not intended to be restrictive of the present invention. The scope of patent protection sought by the applicant is defined by the appended claims.

The invention claimed is:

1. A rail mounting structure, comprising:
    a rail member comprising a first mounting slot and a second mounting slot;
    an auxiliary member movably mounted to the rail member, the auxiliary member comprising a first portion and a second portion; and
    a resilient member for providing a resilient force acting on the auxiliary member;
    wherein the resilient force of the resilient member keeps the auxiliary member at a predetermined position relative to the rail member where the first portion and the second portion of the auxiliary member are adjacent to the first mounting slot and the second mounting slot respectively; and
    the first mounting slot comprises an entrance portion and a positioning portion, the entrance portion of the first mounting slot extends downward from a top of the rail member and forms an entrance, and the positioning portion of the first mounting slot extends substantially perpendicularly from a bottom of the entrance portion for a distance.

2. The rail mounting structure of claim 1, wherein the first portion of the auxiliary member further comprises an extended section extending to a position corresponding to the positioning portion of the first mounting slot.

3. The rail mounting structure of claim 1, wherein the second mounting slot comprises an entrance portion and a positioning portion, the entrance portion of the second mounting slot extends downward from a top of the rail member and forms an entrance, the positioning portion of the second mounting slot is located at a bottom of the entrance portion, and the second portion of the auxiliary member further comprises an extended section extending to a position corresponding to a position between the entrance portion and the positioning portion of the second mounting slot.

4. The rail mounting structure of claim 1, wherein each of the rail member and the auxiliary member further comprises a connecting portion, and the resilient member is connected between the two connecting portions.

5. The rail mounting structure of claim 4, wherein the auxiliary member further comprises an elongated aperture, and the resilient member is located in the elongated aperture.

6. The rail mounting structure of claim 1, wherein the rail member further comprises a contact portion, and the resilient member is connected to the auxiliary member and pressed against the contact portion.

7. A rail mounting structure applicable to an object, wherein the object comprises a first mounting member and a second mounting member, the rail mounting structure comprising:
    a rail member comprising a first mounting slot and a second mounting slot;
    an auxiliary member movably mounted to the rail member, the auxiliary member comprising a first portion and a second portion, wherein the first portion is adjacent to the first mounting slot, and the second portion is adjacent to the second mounting slot; and
    a resilient member for providing a resilient force acting on the auxiliary member;
    wherein while being mounted to the first mounting slot of the rail member, the first mounting member of the object pushes the first portion of the auxiliary member and overcomes the resilient force of the resilient member such that the auxiliary member is displaced to a position, allowing the second mounting member of the object to be mounted to the second mounting slot of the rail member.

8. The rail mounting structure of claim 7, wherein the first mounting slot comprises an entrance portion and a positioning portion; the entrance portion of the first mounting slot extends downward from a top of the rail member and forms an entrance; the positioning portion of the first mounting slot extends substantially perpendicularly from a bottom of the entrance portion for a distance; the first portion of the auxiliary member further comprises an extended section adjacent to one side of the positioning portion of the first mounting slot; and the first mounting member further comprises a head section and a body section connected to the head section such that, while the body section of the first mounting member is being mounted to the positioning portion of the first mounting slot, the head section of the first mounting member pushes the extended section of the first portion of the auxiliary member and thereby displaces the auxiliary member.

9. The rail mounting structure of claim 7, wherein the second mounting slot comprises an entrance portion and a positioning portion, the entrance portion of the second mounting slot extends downward from a top of the rail member and forms an entrance, the positioning portion of the second mounting slot is located at a bottom of the entrance portion, and the second portion of the auxiliary member further comprises an extended section adjacent to a position between the entrance portion and the positioning portion of the second mounting slot.

10. A rail mounting structure, comprising:
a rail member comprising a first mounting slot and a second mounting slot;
an auxiliary member movably mounted to the rail member, the auxiliary member comprising a first portion and a second portion; and
a resilient member for providing a resilient force acting on the auxiliary member;
wherein the resilient force of the resilient member keeps the auxiliary member at a predetermined position relative to the rail member where the first portion and the second portion of the auxiliary member are adjacent to the first mounting slot and the second mounting slot respectively; and
the second mounting slot comprises an entrance portion and a positioning portion, the entrance portion of the second mounting slot extends downward from a top of the rail member and forms an entrance, the positioning portion of the second mounting slot is located at a bottom of the entrance portion, and the second portion of the auxiliary member further comprises an extended section extending to a position corresponding to a position between the entrance portion and the positioning portion of the second mounting slot.

11. The rail mounting structure of claim 10, wherein each of the rail member and the auxiliary member further comprises a connecting portion, and the resilient member is connected between the two connecting portions.

12. The rail mounting structure of claim 11, wherein the auxiliary member further comprises an elongated aperture, and the resilient member is located in the elongated aperture.

13. The rail mounting structure of claim 10, wherein the rail member further comprises a contact portion, and the resilient member is connected to the auxiliary member and pressed against the contact portion.

14. A rail mounting structure, comprising:
a rail member comprising a first mounting slot and a second mounting slot;
an auxiliary member movably mounted to the rail member, the auxiliary member comprising a first portion and a second portion; and
a resilient member for providing a resilient force acting on the auxiliary member;
wherein the resilient force of the resilient member keeps the auxiliary member at a predetermined position relative to the rail member where the first portion and the second portion of the auxiliary member are adjacent to the first mounting slot and the second mounting slot respectively;
each of the rail member and the auxiliary member further comprises a connecting portion, and the resilient member is connected between the two connecting portions; and
the auxiliary member further comprises an elongated aperture, and the resilient member is located in the elongated aperture.

15. The rail mounting structure of claim 14, wherein the rail member further comprises a contact portion, and the resilient member is connected to the auxiliary member and pressed against the contact portion.

* * * * *